United States Patent
Lee

(10) Patent No.: US 6,420,244 B2
(45) Date of Patent: Jul. 16, 2002

(54) METHOD OF MAKING WAFER LEVEL CHIP SCALE PACKAGE

(75) Inventor: Chun-Chi Lee, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 59 days.

(21) Appl. No.: 09/785,329

(22) Filed: Feb. 20, 2001

(30) Foreign Application Priority Data

Feb. 21, 2000 (TW) ........................................ 89103108 A

(51) Int. Cl.[7] ........................... H01L 21/30; H01L 21/46
(52) U.S. Cl. ........................................ 438/458; 438/113
(58) Field of Search .............................. 438/113, 114, 438/458, 459, 460, 462, 464, 465, 112, 124, 127, 617

(56) References Cited

U.S. PATENT DOCUMENTS

| 5,323,051 | A | | 6/1994 | Adams et al. ............... 257/417 |
|---|---|---|---|---|
| 5,430,325 | A | * | 7/1995 | Sawada et al. ............. 257/618 |
| 5,654,582 | A | * | 8/1997 | Kijima et al. ............... 257/620 |
| 5,925,934 | A | * | 7/1999 | Lim ........................... 257/778 |
| 5,925,936 | A | * | 7/1999 | Yamaji ....................... 257/787 |
| 5,950,070 | A | * | 9/1999 | Razon et al. ................ 438/113 |
| 5,994,783 | A | * | 11/1999 | You ............................ 257/778 |
| 6,004,867 | A | * | 12/1999 | Kim et al. ................... 438/459 |
| 6,046,504 | A | * | 4/2000 | Kimura ....................... 257/775 |

FOREIGN PATENT DOCUMENTS

JP    57017152 A  *  1/1982  ................... 216/18

* cited by examiner

Primary Examiner—David Nelms
Assistant Examiner—Phuc T. Dang
(74) Attorney, Agent, or Firm—Stevens, Davis, Miller & Mosher, LLP

(57) ABSTRACT

A method for fabricating the wafer level chip scale package (WLCSP) is developed. This method mainly comprises the steps of: disposing a wafer on the top surface of a retractable film, the wafer having a plurality of chips and a plurality of cutting lines therebetween, each chip having a plurality of bonding pads; cutting the wafer into individual chips along the cutting lines; stretching the retractable film so as to separate the cut chips from one another with a predetermined distance; molding the cut wafer in order to encapsulate the bonding pads and sides of each chip completely; grinding the encapsulated chip to expose the bonding pads out of the molding compound; and sawing the encapsulated chips into individual semiconductor package unit.

12 Claims, 4 Drawing Sheets

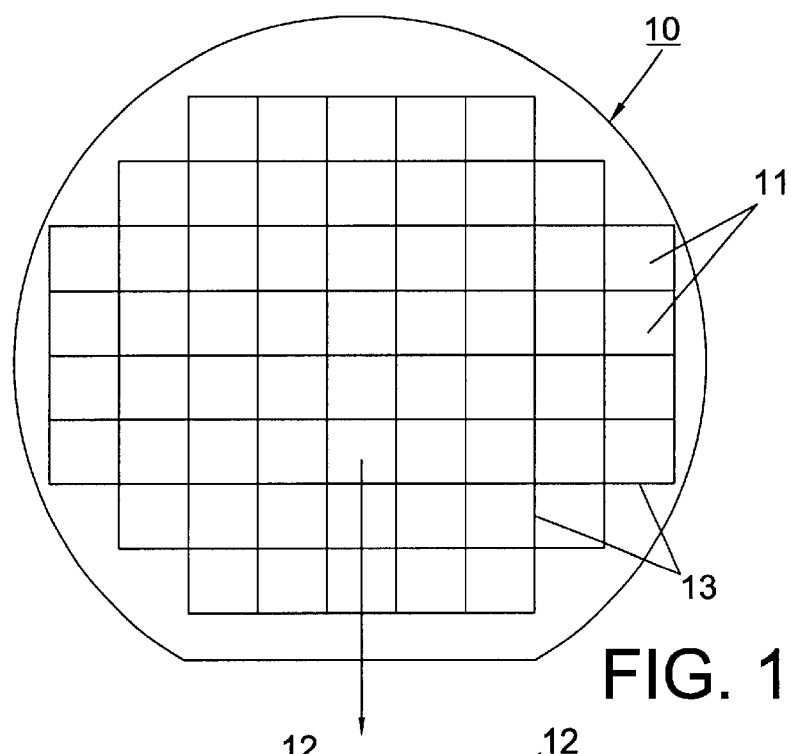
FIG. 1a
FIG. 1b
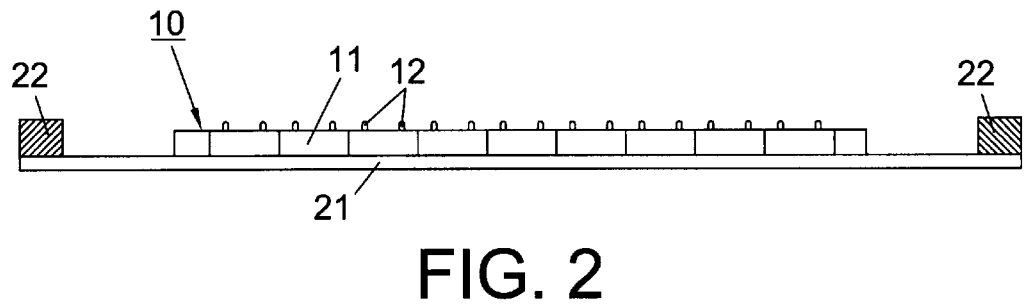
FIG. 2

METHOD OF MAKING WAFER LEVEL CHIP SCALE PACKAGE

BACKGROUND OF THE INVENTION

1. Field of the Invention

The present invention generally relates to a semiconductor package, and more particularly to a wafer level chip scale package (WLCSP) and a method for fabricating the same.

2. Description of Prior Art

As electronic devices have become more smaller and thinner, the velocity and the complexity of IC chip become more and more higher. Accordingly, a need has arisen for higher packaging efficiency. Demand for miniaturization is the primary catalyst driving the usage of advanced packages such as chip scale packages (hereinafter referred as CSP) and flip chips. Both of them greatly reduce the amount of board real estate required when compared to the alternative ball grid array (hereinafter referred as BGA) and thin small outline package (hereinafter referred as TSOP). Typically, a CSP is 20 percent larger than the chip itself. The most obvious advantage of the CSP is the size of the package; that is, the package is slightly larger than the chip. Another advantage of the CSP is that the package facilitates test and burn-in before assembly as an alternative to known good die (KGD) testing. In addition, the CSP can combine many of the benefits of surface mount technology (SMT), such as standardization, encapsulation, surface mount, and reworkability, with the benefits of flip chip technology, such as low inductance, high I/O count, and direct thermal path.

However, as compared with conventional BGA or TSOP, the CSP has the disadvantage of higher manufacturing cost. However, this problem could be eliminated if the CSPs could be mass produced more easily. Therefore, the semiconductor packaging industry has tried to develop mass production techniques at the wafer-level for manufacturing the chip-sized packages, as illustrated in U.S. Pat. Nos. 5,323,051, 5,925,936 and 6,004,867.

According to the wafer level chip scale packages disclosed in the above-mentioned U.S. Patents, each chip of the wafer is encapsulated before die sawing. After the wafer is encapsulated, each encapsulated wafer is sawed to form an individual semiconductor package unit. However, the sides of the semiconductor package unit are exposed to the ambient environment, and thus the semiconductor package is liable to be damaged by the moisture, and the reliability and service life of such semiconductor package unit will be greatly affected. Therefore, semiconductor package manufacturers try to develop a new fabrication method of wafer level chip scale package to provide a better isolation for moisture.

SUMMARY OF THE INVENTION

A primary object of the invention is to provide a method for fabricating the wafer level chip scale package in mass-production, thereby significantly decreasing manufacturing cost thereof.

Another object of the invention is to provide a method for fabricating the wafer level chip scale package, wherein the chip scale package has a structure with better moisture isolation so as to prevent the chips from damage by moisture.

In order to achieve the above-mentioned objects, the method for making the wafer level chip scale package according to the present invention mainly comprises the steps of: disposing a wafer on the top surface of a retractable film, the wafer having a plurality of chips and a plurality of cutting lines therebetween, each chip having a plurality of bonding pads; cutting the wafer into individual chips along the cutting lines; stretching the retractable film so as to separate the cut chips from one another with a predetermined distance; molding the cut wafer in order to encapsulate the bonding pads and sides of each chip completely; grinding the encapsulated chip to expose the bonding pads out of the molding compound; and sawing the encapsulated chips into individual semiconductor package unit.

According to the method for fabricating the wafer level chip scale package, the retractable film is secured by a frame, which is fixed by a fixture. The retractable film is displaced on a work platform and this platform can move up, with respect to the fixture, to stretch the retractable film such that each chip is separated from one another with a predetermined distance. The encapsulated wafer is sawed into individual semiconductor package unit by a cutter, wherein the predetermined distance between each chip is larger than the thickness of the cutter. Hence, the sides of individual semiconductor package unit are encapsulated by the molding compound. Therefore, the method of fabricating the wafer level chip scale package according to the present invention can provide a better result of moisture isolation and prevent the semiconductor chip from destroying by moisture.

BRIEF DESCRIPTION OF DRAWINGS

Other objects, aspects and advantages will become apparent from the following description of embodiments with reference to the accompanying drawings in which:

FIG. 1a is a perspective view of a wafer according to the present invention.

FIG. 1b is an enlarged cross-section view of a chip according to the present invention.

FIG. 2 is a cross-section view of the wafer, which is displaced on a retractable film according to the present invention.

DETAILED DESCRIPTION OF THE PREFERRED EMBODIMENTS

Figure 3:
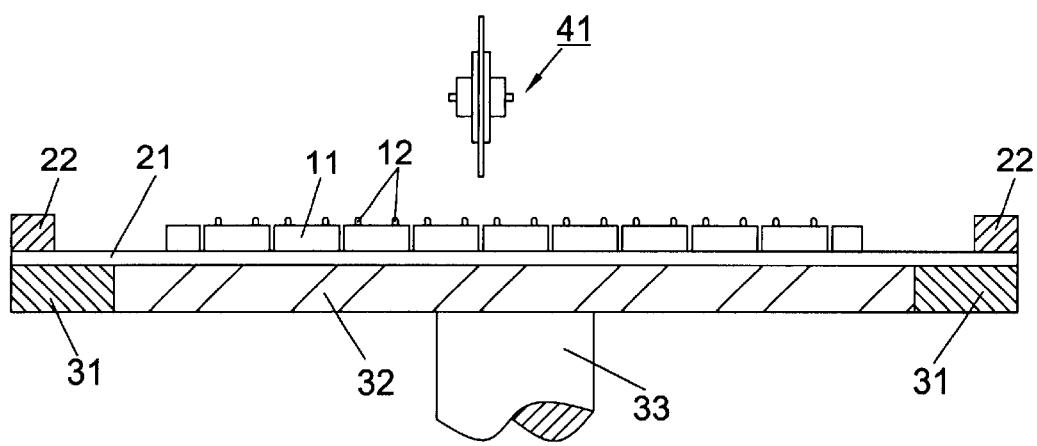
FIG. 3 is a cross-section view of the wafer, in which the wafer is sawed into individual chips along the cutting lines according to the present invention.

The present invention relates to a method for fabricating the wafer level chip scale package (WLCSP). The method in accordance with the present invention can manufacture CSP in mass production so as to lower the manufacturing cost of CSP, and provide a better result of moisture isolation, thereby preventing the semiconductor chip from destroying by moisture. The present invention now will become apparent from the following preferred embodiments with reference to the accompanying drawings. In the accompanying drawings, the same reference numeral designates the same element throughout.

FIG. 1a is a perspective view of a wafer 10 according to the present invention. The wafer 10 has a plurality of chips 11 and a plurality of cutting lines 13 therebetween. FIG. 1b is an enlarged cross-section view of a chip 11 in FIG. 1a, wherein each chip 11 has a plurality of protruding bonding pads 12 located on the active surface of the chip 11. The protruding bonding pads 12 can be deposited on the electrode terminals of the chip 11 by plating. The materials of the bonding pads 12 are made from conductive metal, such as solders and gold, and they can be jointed to a substrate by soldering.

As shown in FIG. 2, a wafer 10 according to the present invention is disposed on the top surface of a retractable film 21. The retractable film is secured by a frame 22. The wafer 10 is adhered by an adhesive to the retractable film 21. As shown in FIG. 3, the frame 22 can be fixed by a fixture 31 and the retractable film 21 is displaced on a work platform 32. The platform 32 can move up relative to the fixture. Next, the wafer 10 is cut by a cutter 41 into individual chip 11 along the cutting lines 13 (shown in FIG. 1a).

Figure 4:
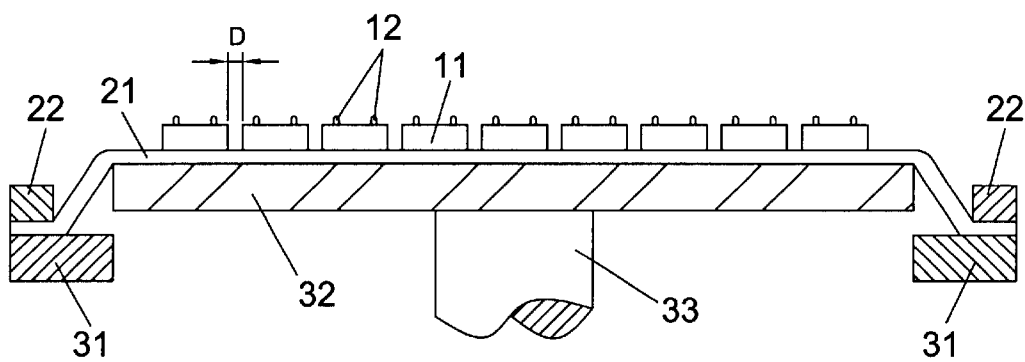
FIG. 4 is a cross-section view of the wafer, in which the retractable film is stretched to increase the distance between each chip according to the present invention.
Figure 5A:
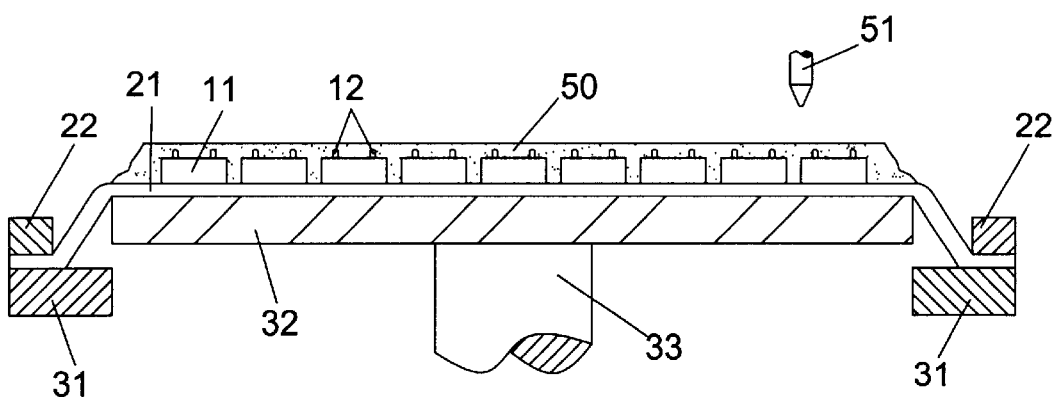
FIGS. 5a and 5b are cross-section views of the encapsulated wafer according to the present invention.
Figure 5B:
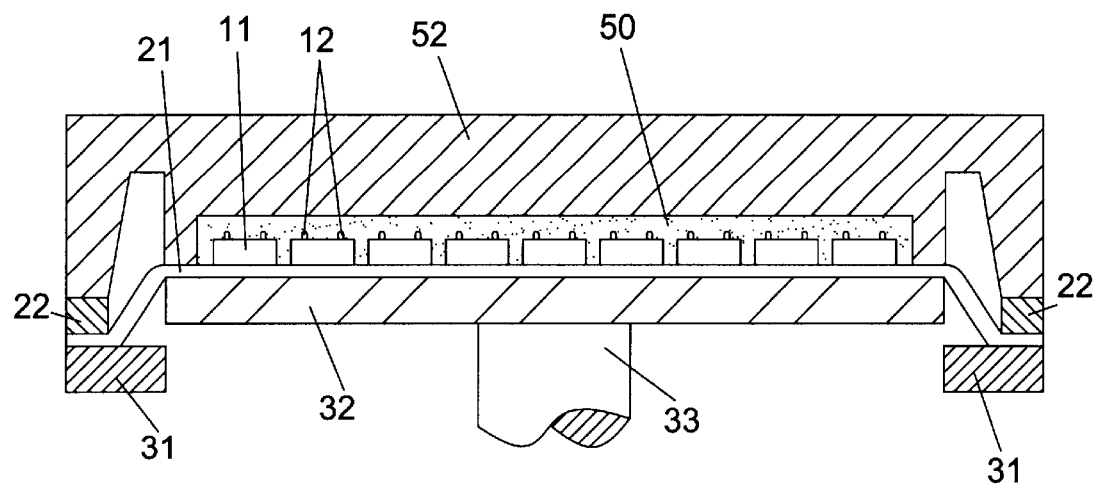

As shown in FIG. 4, a shaft 33 moves upward to lift the platform 32 relative to the fixture 31. The retractable film 21 will be stretched so that the distance between each chip 11 will be increased to a predetermined distance D. As shown in FIGS. 5a and 5b thermosetting molding compound 50 can be either by dispensing (e.g., by means of dispenser 51 shown in FIG. 5a) or injection molding (shown in FIG. 5b) to encapsulate the cut wafer 10, and the molding compound 50 will encapsulate the bonding pads 12 of each chip 11 and the sides thereof. If the injection molding method is used, it is better to utilize the transfer mold. The mold 52 is displaced on the top of the retractable film 21, the cavity of the mold 52 covers the entire wafer 10. Then the molding compound 50 is injected into the cavity of the mold 52 to encapsulate the bonding pads 12 of each chip 11 and the sides thereof completely.

Figure 6A:
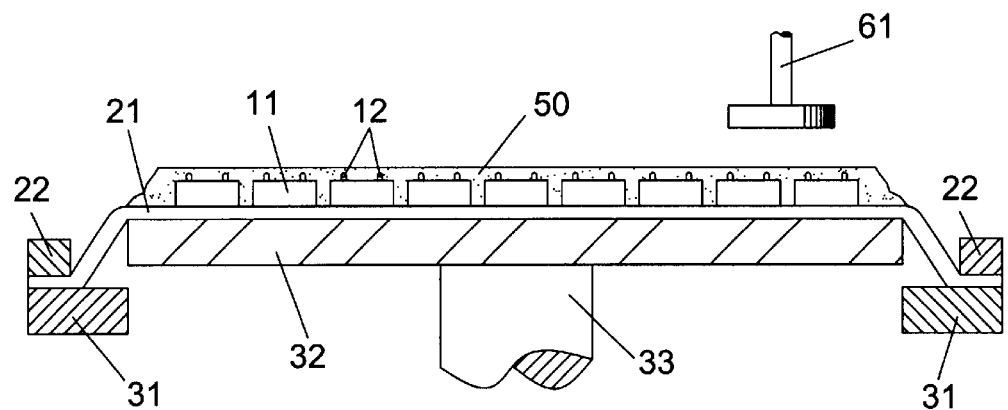
FIGS. 6a and 6b are cross-section views of the encapsulated wafer in which the molding compound is ground so as to expose the bonding pads out of the molding compound according to the present invention.
Figure 6B:
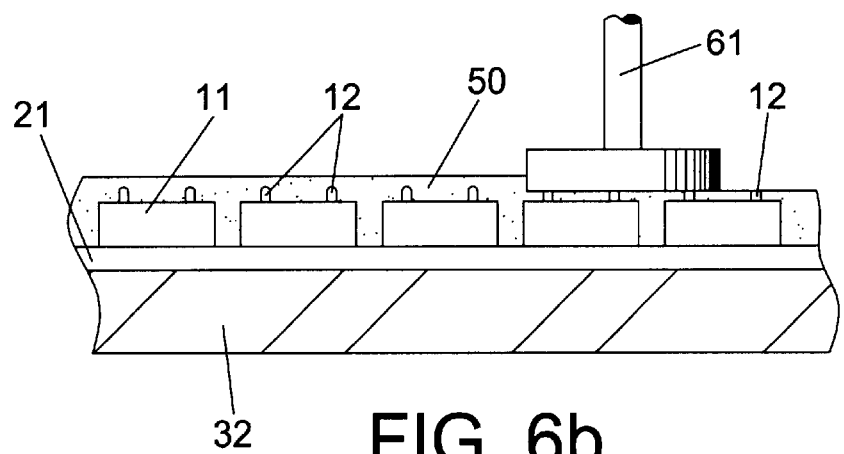
Figure 7:
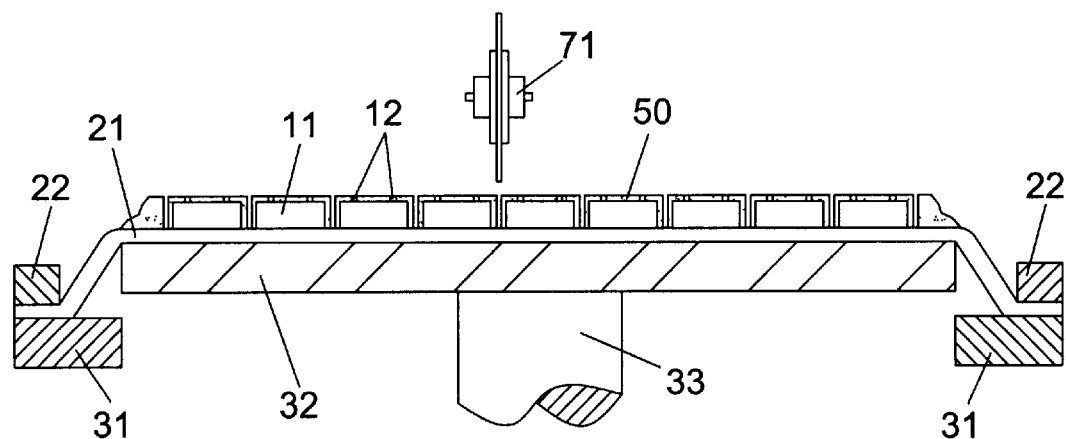
FIG. 7 is a cross-section view of the encapsulated wafer in which the encapsulated wafer is sawed into individual semiconductor package unit by a cutter according to the invention.

As shown in FIGS. 6a and 6b, a grinding wheel 61 is used to mechanically grind the molding compound 50 in order to expose the bonding pads 12 out of the molding compound 50. As shown in FIG. 7, the encapsulated wafer 10 is sawed into individual semiconductor package unit by a cutter 71. The predetermined distance D is larger than the thickness of the cutter 71, so that the sides of each chip 11 are completely encapsulated by the molding compound 50.

Figure 8:
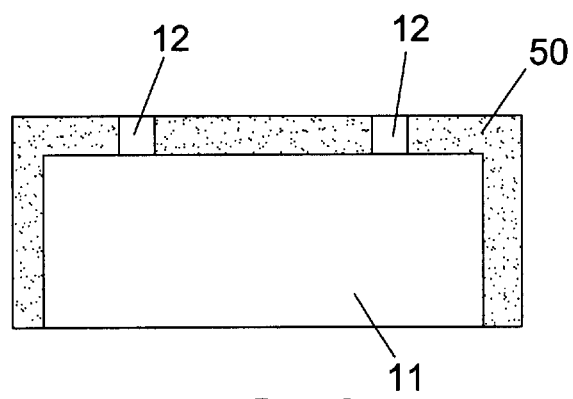
FIG. 8 is an enlarged cross-section view of individual semiconductor package unit of the FIG. 7.

FIG. 8 is an enlarged cross-section view of the chip 11 shown in FIG. 7. The sides of each chip 11 are completely encapsulated by the molding compound 50. Therefore, the present invention provides a better result of moisture isolation, thereby preventing the semiconductor chip from destroying by moisture.

According to the above-mentioned preferred embodiment, the wafer 10 is displaced on the top surface of the retractable film 21 with the bonding pads 12 facing upwards. In accordance with another embodiment of the present invention, the wafer 10 is displaced on the top surface of the retractable film 21 with the bonding pads 12 facing downwards. The protruding bonding pads 12 will be in contact with retractable film 21. Therefore, during molding, the molding compound 50 only encapsulates the peripheral area of protruding bonding pads. In this way, it does not need to use the grinding wheel to grind the molding compound 50 and the protruding bonding pads 12, the top of the bonding pads will be exposed from the molding compound naturally.

As apparent from the above descriptions, the present invention provides a method for fabricating the wafer level chip scale package (WLCSP) for manufacturing the CSP in mass-production and lower the manufacturing cost of CSP. In addition, the structure of WLCSP provides a better result of moisture isolation and hence prevents semiconductor chip from destroying by moisture.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating the wafer level chip scale package comprising:
    disposing a wafer on a top surface of a retractable film, the wafer having a plurality of chips and a plurality of cutting lines therebetween, each chip having a plurality of bonding pads;
    cutting the wafer into individual chips along the cutting lines;
    stretching the retractable film so as to separate the cut chips from one another with a predetermined distance;
    molding the cut wafer in order to encapsulate the bonding pads and sides of each chip completely with molding compound;
    sawing the encapsulated chips into individual semiconductor package unit.

2. The method for fabricating wafer level chip scale package of claim 1, further comprising a grinding step to grind encapsulated wafer to expose the bonding pads of the chip out of the molding compound.

3. The method for fabricating wafer level chip scale package of claim 1, wherein the molding compound is encapsulated by dispensing.

4. The method for fabricating wafer level chip scale package of claim 1, wherein the molding compound is encapsulated by injection molding.

5. The method for fabricating wafer level chip scale package of claim 1, wherein the molding compound is encapsulated by transfer molding.

6. The method for fabricating wafer level chip scale package of claim 1, wherein the wafer is disposed on the top surface of the retractable film with bonding pads facing upwards.

7. The method for fabricating wafer level chip scale package of claim 1, wherein the wafer is disposed on the top surface of the retractable film with bonding pads facing downwards.

8. The method for fabricating wafer level chip scale package of claim 1, wherein the encapsulated wafer is mechanically grinded by a grinding wheel to expose the bonding pads out of the molding compound.

9. The method for fabricating wafer level chip scale package of claim 1, wherein the retractable film is secured by a frame.

10. The method for fabricating wafer level chip scale package of claim 9, wherein the frame is fixed by a fixture and the retractable film is displaced on a work platform where the platform can be moved upwards, relative to the fixture, to stretch the retractable film such that each chip is separated from one another with a predetermined distance.

11. The method for fabricating wafer level chip scale package of claim 1, wherein the encapsulated wafer is sawed into individual semiconductor package unit by a cutter.

12. The method for fabricating wafer level chip scale package of claim 11, wherein the predetermined distance among each chip is larger than the thickness of the cutter in order to encapsulate the sides of each chip completely.

* * * * *